United States Patent
Hikmet et al.

(10) Patent No.: US 11,371,662 B2
(45) Date of Patent: Jun. 28, 2022

(54) FILAMENT LAMP

(71) Applicant: SIGNIFY HOLDING B.V., Eindhoven (NL)

(72) Inventors: Rifat Ata Mustafa Hikmet, Eindhoven (NL); Ties Van Bommel, Horst (NL); Johannes Petrus Maria Ansems, Hulsel (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 17/415,152

(22) PCT Filed: Dec. 17, 2019

(86) PCT No.: PCT/EP2019/085503
§ 371 (c)(1),
(2) Date: Jun. 17, 2021

(87) PCT Pub. No.: WO2020/127163
PCT Pub. Date: Jun. 25, 2020

(65) Prior Publication Data
US 2022/0057049 A1    Feb. 24, 2022

(30) Foreign Application Priority Data

Dec. 21, 2018  (EP) .................................... 18215049

(51) Int. Cl.
*F21K 9/232*    (2016.01)
*F21K 9/66*    (2016.01)
*F21K 9/62*    (2016.01)

(52) U.S. Cl.
CPC ................ *F21K 9/232* (2016.08); *F21K 9/62* (2016.08); *F21K 9/66* (2016.08)

(58) Field of Classification Search
CPC ............... F21K 9/232; F21K 9/62; F21K 9/66
See application file for complete search history.

(56) References Cited

U.S. PATENT DOCUMENTS

| | | | |
|---|---|---|---|
| 8,400,051 | B2 | 3/2013 | Hakata et al. |
| 2011/0084297 | A1 | 4/2011 | Ogata et al. |
| 2012/0161626 | A1 | 6/2012 | van de Ven et al. |
| 2012/0287652 | A1 | 11/2012 | Breidenassel et al. |

(Continued)

FOREIGN PATENT DOCUMENTS

| CN | 202902165 U | 4/2013 |
|---|---|---|
| CN | 103104817 A | 5/2013 |

(Continued)

*Primary Examiner* — Karabi Guharay
(74) *Attorney, Agent, or Firm* — Daniel J. Piotrowski

(57) ABSTRACT

The invention provides a light generating device (1000) comprising:—a light source (100) comprising a light emitting surface (110), wherein the light source (100) is configured to generate light source light (101), wherein the light emitting surface (110) is configured in a light chamber (200);—the light chamber (200), wherein the light chamber (200) is at least partly defined by a chamber wall (210), wherein the chamber wall (210) comprises: (i) a first part (211), wherein the first part (211) is transmissive for the light source light (101), wherein the first part (211) has a first reflectance R1 for the light source light (101), and wherein the first part (211) has a first part area (A1); and (ii) one or more second parts (212), wherein each second part (212) is transmissive for the light source light (101), has a second reflectance R2 for the light source light (101), and wherein the one or more second parts (212) together have a second part area (A2), wherein R1−R2≥20%, wherein 65%≤R1<100%, and wherein the second part area (A2) is smaller than the first part area (A1).

15 Claims, 6 Drawing Sheets

(56) References Cited

U.S. PATENT DOCUMENTS

| | | | |
|---|---|---|---|
| 2014/0119007 A1* | 5/2014 | Edmond | ............ F21V 3/10 362/235 |
| 2015/0036333 A1 | 2/2015 | Tsuei et al. | |
| 2016/0109068 A1 | 4/2016 | Boonekamp et al. | |

FOREIGN PATENT DOCUMENTS

| CN | 202938097 U | 5/2013 |
|---|---|---|
| CN | 103759155 B | 3/2016 |
| CN | 105546371 A | 5/2016 |
| CN | 106322152 A | 1/2017 |

* cited by examiner (1)　　　(2)　　　(3)　　　(4)

(5)　　　(6)　　　(7)　　　(8)

FILAMENT LAMP

CROSS-REFERENCE TO PRIOR APPLICATIONS

This application is the U.S. National Phase application under 35 U.S.C. § 371 of International Application No. PCT/EP2019/085503, filed on Dec. 17, 2019, which claims the benefit of European Patent Application No. 18215049.0, filed on Dec. 21, 2018. These applications are hereby incorporated by reference herein.

FIELD OF THE INVENTION

The invention relates to a light generating device and to a light generating system comprising such device.

BACKGROUND OF THE INVENTION

Filament type lamps are known in the art. Recently, a new type of filament-like lamps was introduced. U.S. Pat. No. 8,400,051B2, for instance, describes a light-emitting device comprising: an elongated bar-shaped package with left and right ends, the package being formed such that a plurality of leads are formed integrally with a first resin with part of the leads exposed; a light-emitting element that is fixed onto at least one of the leads and that is electrically connected to at least one of the leads; and a second resin sealing the light-emitting element, wherein the leads are formed of metal, an entire bottom surface of the light-emitting element is covered with at least one of the leads, an entire bottom surface of the package is covered with the first resin, the first resin has a side wall that is integrally formed with a portion covering the bottom surface of the package and that is higher than upper surfaces of the leads, the first resin and the second resin are formed of optically transparent resin, the second resin that is filled to the side wall of the first resin and that includes a fluorescent material having a larger specific gravity than that of the second resin, the leads have outer lead portions that are used for external connection and that protrude in a longitudinal direction of the package from the left and right ends; wherein the fluorescent material is arranged to concentrate near the light emitting element, and is excited by part of light emitted by the light-emitting element so as to emit a color different from a color of the light emitted by the light-emitting element, and the side wall transmits part of light that is emitted by the light-emitting element and that enters the side wall and part of light emitted from the fluorescent material to the portion covering the bottom surface of the package.

US2012/161626A1 discloses an LED lamp with an LED assembly and an enclosure to protect the LEDs. The enclosure includes a cone reflector disposed above the LED assembly.

US2016/109068A1 discloses a tubular lighting device comprising an elongated heat sink, multiple light source mounted on the heat sink, and an elongated hollow tubular member arranged along the elongated heat sink. The tubular member comprises a lens and a light exit surface. The light exit surface has a diffusing portion with a transparent portion on each side of the diffusing portion.

US2015/036333A1 discloses a dome-shaped molded resin product that is provided with a phosphor layer made of a resin. The phosphor layer includes a shape maintaining member that is formed in a lattice shape by line-like members that are made of a material having a higher elasticity modulus than the resin.

SUMMARY OF THE INVENTION

Incandescent lamps are rapidly being replaced by LED based lighting solutions. It is nevertheless appreciated and desired by users to have retrofit lamps which have the look of an incandescent bulb. One of the concepts is based on LED filaments placed in such a bulb (see also above). However, current LED filament lamps are relatively complicated to produce. Further, current LED filament lamps do not provide color tunability.

Hence, it is an aspect of the invention to provide an alternative light generating device (and/or light generating system), which preferably further at least partly obviate(s) one or more of above-described drawbacks. The present invention may have as object to overcome or ameliorate at least one of the disadvantages of the prior art, or to provide a useful alternative.

Amongst others, in embodiments herein a kind of filament lamp is proposed, such as a (color tunable) LED filament lamp, which comprises a light source arranged in a mixing chamber (and in embodiments a controller adapted to control the light source having a plurality of solid state light emitters). The mixing chamber especially comprises light transmissive regions which delimit light exit areas which have a higher light transmissivity than the light transmissive regions. The light transmissive regions and the light exit areas may especially exhibit isotropic luminance. In embodiments, the light exit areas have the shape of a slit.

In a first aspect, the invention provides a light generating device ("device") comprising: (a) a light source comprising a light emitting surface, wherein the light source is configured to generate light source light, wherein the light emitting surface is configured in a light chamber; (b) wherein the light chamber is at least partly defined by a chamber wall, wherein the chamber wall ("light chamber wall") comprises: (i) a first part ("light transmissive region"), wherein the first part is transmissive for the light source light, wherein the first part has a first reflectance $R1$ for the light source light, and wherein the first part has a first part area ($A1$); and (ii) one or more second parts ("light exit areas"), wherein each second part is transmissive for the light source light, has a second reflectance $R2$ for the light source light, and wherein the one or more second parts together have a second part area ($A2$), wherein in specific embodiments (i) $R1 > R2$, especially wherein $R1 - R2 \geq 20\%$, and wherein in specific embodiments (ii) $R1 < 100\%$, even more especially wherein $65\% \leq R1 < 100\%$. The ratio of the second part area ($A2$) to the first part area ($A1$) is in the range of $0.005 \leq A2/A1 \leq 0.05$. Further, in specific embodiments (iii) the second part area ($A2$) is smaller than the first part area ($A1$).

With such light generating device it is possible to provide a kind of filament-like lamp. The light chamber wall is light transmissive for the light source light and may in embodiments provide light in many directions, such as for instance in the case of a light bulb. Due to the fact that there are different transmissivities or different reflectances, the second part will be brighter than the first part. Due to the fact that the second part is smaller than the first part, and due to the larger brightness of the second part, e.g. a filament-type lamp perception or incandescent-type lamp perception is created. Hence, in embodiments a low-cost, (color tunable) LED filament lamp may be proved (see also below). The light generating device may be produced easier than luminescent material based filament lamps. Further, the present light generating device may be more robust.

As indicated above, the light generating device comprises a light source and a light chamber. The light generating device is especially configured to generate device light (during operation of the device). The device may essentially be based on the light source light, and may in embodiments consist of the light source light.

The light source comprises a light emitting surface, such as a die of a solid state light source. The light source is configured to generate light source light. This light source light emanates from the light emitting surface (during operation of the light source).

The term "light source" may refer to a semiconductor light-emitting device, such as a light emitting diode (LEDs), a resonant cavity light emitting diode (RCLED), a vertical cavity laser diode (VCSELs), an edge emitting laser, etc. The term "light source" may also refer to an organic light-emitting diode, such as a passive-matrix (PMOLED) or an active-matrix (AMOLED). In a specific embodiment, the light source comprises a solid state light source (such as a LED or laser diode). In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module.

The term "light source" may also relate to a plurality of light sources, such as 2-2000 solid state light sources.

In embodiments, the light source may be configured to generate white light. Hence, in specific embodiments the light generating device is configured to generate white light source light. When the light generating device comprises a plurality of light sources having different spectral distribution of the (respective) light source light, the light generating device may (also) be configured to generate white light source light, or may be configured to generate white light source light in a controlling mode (see also below).

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

In an embodiment, the light source may also provide light source light having a correlated color temperature (CCT) between about 5000 and 20000 K, e.g. direct phosphor converted LEDs (blue light emitting diode with thin layer of phosphor for e.g. obtaining of 10000 K). Hence, in a specific embodiment the light source is configured to provide light source light with a correlated color temperature in the range of 5000-20000 K, even more especially in the range of 6000-20000 K, such as 8000-20000 K. An advantage of the relative high color temperature may be that there may be a relatively high blue component in the light source light.

In embodiments, the light source may be controllable in intensity. To this end, the light generating device may comprise a control system or may be functionally coupled to a control system. When there are in embodiments more than one light source, the intensity of the light sources may in specific embodiments be controllable and/or in (other) specific embodiments the spectral distribution of the light emanation from the device, i.e. the device light, may be controllable.

Hence, in embodiments the light generating device comprises a plurality of light sources, especially a plurality of solid state light sources, configured to generate light source light. In further specific embodiments, two or more subsets of the light sources, especially two or more subsets of solid state light sources, are configured to generate solid state light source light having different spectral distributions, such as e.g. blue, green and red, or white and red, etc. Hence, in specific embodiments the control system may be configured to control one or more lighting parameters of the device light. In further specific embodiments, the control system is configured to control one or more of color temperature, color point, and luminous flux.

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The system, or apparatus, or device may execute an action in a "mode" or "operation mode" or "mode of operation". Likewise, in a method an action or stage, or step may be executed in a "mode" or "operation mode" or "mode of operation". The term "mode" may also be indicated as "controlling mode". This does not exclude that the system, or apparatus, or device may also be adapted for providing another controlling mode, or a plurality of other controlling modes. Likewise, this may not exclude that before executing the mode and/or after executing the mode one or more other modes may be executed.

However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, that can only operate in a single operation mode (i.e. "on", without further tunability).

Hence, in embodiments, the control system may control in dependence of one or more of an input signal of a user interface, a sensor signal (of a sensor), and a timer. The term "timer" may refer to a clock and/or a predetermined time scheme.

As indicated above, the light source comprises a light emitting surface. For instance, when the light source comprises a solid state light source, the light emitting surface may be the surface of a die, or the surface of a light converter element. The term "light emitting surface" may also refer to a plurality of (different) light emitting surfaces of the (same) light source. In specific embodiments, the light generating device comprises a plurality of solid state light sources configured to generate light source light, wherein the solid state light sources comprise light emitting surfaces configured in the light chamber.

The light emitting surface may also be the surface of a solid collimator, optically coupled to a light generating element, such as a solid state light source. The light emitting surface may also be the surface of a lens, optically coupled to a light generating element, such as a solid state light source. The light emitting surface may also be the surface of a luminescent material comprising element, such as a luminescent material comprising layer or a luminescent material comprising dome, optically coupled to a light generating element, such as a solid state light source.

The terms "radiationally coupled" or "optically coupled" may especially mean that (i) a light generating element, such as a light source, and (ii) another item or material, are associated with each other so that at least part of the radiation emitted by the light generating element is received by the item or material. In other words, the item or material is configured in a light-receiving relationship with the light generating element. At least part of the radiation of the light generating element will be received by the item or material. This may in embodiments be directly, such as the item or material in physical contact with the (light emitting surface of the) light generating element. This may in embodiments be via a medium, like air, a gas, or a liquid or solid light guiding material. In embodiments, also one or more optics, like a lens, a reflector, an optical filter, may be configured in the optical path between light generating element and item or material.

The term "light source" may (thus) refer to a light generating element as such, like e.g. a solid state light source, or e.g. to a package of the light generating element, such as a solid state light source, and one or more of a luminescent material comprising element and (other) optics, like a lens, a collimator. A light converter element ("converter element" or "converter") may comprise a luminescent material comprising element. For instance, a solid state light as such, like a blue LED, is a light source. A combination of a solid state light source (as light generating element) and a light converter element, such as a blue LED and a light converter element, optically coupled to the solid state light source, may also be a light source. Hence, a white LED is a light source.

The light generating device further comprises a light chamber. The light emitting surface is configured in a light chamber. With the phrase "the light emitting surface is configured in a light chamber" and similar phrases is especially indicated that light source light may only escape from the light generating device via the light chamber.

The light chamber is at least partly defined by a chamber wall. The light chamber especially comprises a cavity, which may be filled with air, or another gas. The light chamber is defined by the chamber wall, and optionally one or more other elements, such as a lamp base. Especially, at least 40% of the internal surface of the chamber is defined by the chamber wall, such as at least 50%, like at least 60%. For instance, assuming a retrofit bulb shaped lamp having a substantially piriform-like shape, at least 70%, or even over 80% of the internal surface of the chamber may be defined by the chamber wall.

In embodiments, the light generating device comprises a lamp base, wherein the light chamber extends from the lamp base. The lamp base may in embodiments comprise (one or more) electronics, such as a control system, a driver, an antenna, a battery, etc. The lamp base may in embodiments also comprise a screw cap.

In specific embodiments, the internal surface of the chamber is defined by light reflective elements, which are especially reflective for the light source light. For instance, the lamp bases may be provided with a light reflective coating. Also, the chamber wall may be reflective. In this way, a cavity or chamber is created wherein by internal reflection at the surfaces that define the area, the intensity distribution at the surfaces may be smaller than without the internal reflection. In this way, also a cavity or chamber is created, wherein light source light may be mixed. Therefore, when a plurality of light source is applied that provide light source light having different spectral distribution, the light of the light sources may also be mixed. In this way, the light that emanates from the light chamber may have a spectral distribution which may essentially be angle independent. Hence, the chamber may also be indicated as "mixing chamber" or "light mixing chamber".

However, the angular intensity distribution of the light that emanates from the light generating device may not be even as it is the intention to create in a relatively simple way a perception of a filament lamp. To this end, the chamber wall has parts that are more transmissive than other parts.

As indicated above, the chamber wall is reflective for light. Hence, the uneven intensity distribution of the light emanating from the light generating device may be created by using a light transmissive chamber wall that has spatially different reflectance regions. Different reflectances may be created by different concentrations and/or types of light scattering structure at the surface of the light chamber wall and/or by different concentrations and/or types of light scattering structures in the chamber wall. A relatively simple way to obtain the different reflectances is by using a light transmissive material with scattering elements and creating thinner parts therein. In this way, in a relatively simple way different parts with different reflectances may be obtained.

Herein, the term reflectance especially refers to the ratio of the light intensity $I_b$ that is reflected back from the chamber window under perpendicular illumination with light with intensity $I_i$. Hence, the parameter $I_b/I_i$ in % indicates the reflectance. Herein, the term reflectance especially refers to the reflectance of visible light, even more especially for reference purposes the reflectance at 550 nm. Visible light has a wavelength selected from the range of 380-780 nm.

In specific embodiments, the reflectance in the range of about 420-750 nm, or even in the entire range of 380-780 nm, is essentially constant over the wavelength range, such as within 25 percent points (or "percentage points") of an average value, like within 20 percent points of an average value, like within 15 percent points of an average value (with the reflectance not being larger than 100% or smaller than 0%). Hence, assuming a reflectance of 80%, the reflectance values over the wavelength range of 420-750 nm may be found in the range of 55-100% (i.e. 80%−25%=55% and 80%+25% becomes 100%, assuming the 25 percent points range as indicated above as example), but in average over this wavelength range the reflectance is 80%.

Likewise, the transmission in the range of about 420-750 nm, or even in the entire range of 380-780 nm, is essentially constant over the wavelength range, such as within 25 percent points (or "percentage points") of an average value, like within 20 percent points of an average value, like within 15 percent points of an average value (with the reflectance not being larger than 100% or smaller than 0%).

Hence, at least part of the light source light that reaches the chamber wall is reflected. Especially, the chamber wall is diffusively reflecting. Hence, the internal surface of the chamber wall and/or the interior of the chamber wall comprise scattering elements, like scattering particles, surface roughness, etc. Hence, at least part of the light source light that is reflected, is diffusively reflected, such as at least 20%, like at least 40%, such as at least 60%, or even more.

Therefore, at least part of the light source light that reaches the chamber wall may be scattered at the surface or may be scattered in the bulk of the chamber wall, and part of the light source light may effectively be transmitted (optionally after some scattering) from the chamber wall. As the chamber wall material may not be transparent, also some light source light may be absorbed. Hence, the chamber wall is especially diffusively transmissive.

Hence, in embodiments the chamber wall material may comprise a light transmissive material on which and/or in which scattering elements are provided. The scattering elements may comprise scattering particles.

The light transmissive material may comprise one or more materials selected from the group consisting of a transmissive organic material, such as selected from the group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), silicone, polyvinylchloride (PVC), polyethylene terephthalate (PET), including in an embodiment (PETG) (glycol modified polyethylene terephthalate), PDMS (polydimethylsiloxane), and COC (cyclo olefin copolymer). Especially, the light transmissive material may comprise an aromatic polyester, or a copolymer thereof, such as e.g. polycarbonate (PC), poly(methyl)methacrylate (P(M)MA), polyglycolide or polyglycolic acid (PGA), polylactic acid (PLA), polycaprolactone (PCL), polyethylene adipate (PEA), polyhydroxy alkanoate (PHA), polyhydroxy butyrate (PHB), poly(3-hydroxybutyrate-co-3-hydroxyvalerate) (PHBV), polyethylene terephthalate (PET), polybutylene terephthalate (PBT), polytrimethylene terephthalate (PTT), polyethylene naphthalate (PEN); especially, the light transmissive material may comprise polyethylene terephthalate (PET). Hence, the light transmissive material is especially a polymeric light transmissive material.

However, in another embodiment the light transmissive material may comprise an inorganic material. Especially, the inorganic light transmissive material may be selected from the group consisting of glasses, (fused) quartz, transmissive ceramic materials, and silicones. Also hybrid materials, comprising both inorganic and organic parts may be applied. Especially, the light transmissive material comprises one or more of PMMA, transparent PC, or glass.

Scattering particles may be selected from the group consisting of MgO, $Al_2O_3$, $BaSO_4$, $TiO_2$, $ZrO_2$, etc. etc. Alternatively or additionally, the scattering particles may comprise silicone particles. Especially, the scattering particles are white. Scattering particles may have e.g. weight average particle sizes in the range of 1-100 μm, like 2-40 μm. Scattering particles may also comprise a cluster or conglomerate of nano particles.

The light transmissive material, the thickness of the wall, and the optional scattering particles (or other material optionally comprised by the light transmissive material) are chosen such that the absorption of the light source light of the light source is small. For instance, a glass chamber wall having a thickness of 1 mm may have a light absorption below 1% of the light source light (under perpendicular irradiation with the light source light). The availability of light scattering particles may substantially not contribute to the absorption, as these particles may especially be white. Hence, the availability of light scattering particles in the chamber wall essentially only controls reflectance and transmission and may substantially have no impact on the absorption. Therefore, light transmissive material, the thickness of the wall, and the optional scattering particles (or other material optionally comprised by the light transmissive material) are chosen such that the absorption of the light source light (i.e. visible light of the light source) is equal to or less than 5%, such as equal to or less than 3%, like equal to or less than 2%, such as equal to or less than 1%. Hence, in specific embodiments $R \approx 100-T$ or $T \approx 100-R$. Absorption is especially determined under perpendicular radiation (with the light source light) and at the same wavelengths (i.e. the intensity downstream of the material under investigation is related to the intensity upstream of the material under investigation, both at the same wavelength, such as 550 nm).

Hence, the reflectances chosen are not such, that there is no transmission through the chamber wall. The chamber wall is desired to transmit part of the light source light, but at least part of the chamber wall (the first part) (diffusively) reflects part of the light source light.

The chamber wall thus comprises two parts. The term part may also refer to two or more different parts. As a first part may include a plurality of second parts, amongst others it is herein indicated that the chamber wall comprises a first part and one or more second parts. However, this does not exclude that the chamber wall comprises a plurality of first parts (and one or more second parts). Especially, the chamber wall consists of the first part(s) and the one or more second parts; i.e. in embodiments there are essentially no further parts than the one or more second parts and the first part(s).

As indicated above, the chamber wall comprises (i) a first part, wherein the first part is transmissive for the light source light, wherein the first part has a first reflectance R1 for the light source light, and wherein the first part has a first part area (A1).

The first part is also transmissive for light source light. However, especially the first reflectance is larger than the transmission (at the same wavelengths).

The first part area refers to the internal (macroscopic) surface area of the first part. When there are more first parts, the first parts together define the first part area.

As indicated above, the chamber wall also comprises (ii) one or more second parts, wherein each second part is transmissive for the light source light, has a second reflectance R2 for the light source light, and wherein the one or more second parts together have a second part area (A2).

Especially, the first part is diffusively transmissive.

During operation of the light generating device, the first part may especially exhibit isotropic luminance.

There may be one second part, but there may also be a plurality of second parts.

The second part is also transmissive for light source light. In embodiments, especially the second reflectance is larger than the transmission (at the same wavelengths). However, in other embodiments the second reflectance is smaller than the transmission (at the same wavelengths). In yet further embodiments, the reflectance is close to 0%, and all light may be transmitted through the chamber wall of the second part (except for some absorption). These latter two embodiments, and especially the last embodiment, may apply when there is a second chamber circumferentially surrounding the first chamber (see further below).

Especially, the second part is diffusively transmissive.

During operation of the light generating device, the second part may especially exhibit isotropic luminance.

The second part area refers to the internal (macroscopic) surface area of the second part. When there are more second parts, the second parts together define the second part area.

The first reflectance is larger than the second reflectance. In this way, the transmission through the first part may be lower than through the second part. The reflectances of the first part and of the second part, respectively, are less than 100%, as there should be some transmission. Hence, in embodiments R1<100% and R2<100%. Especially, as indicated above, R2<R1. Hence, in embodiments the second part may appear brighter than the first part. In specific embodiments, R1−R2≥10%, especially R1−R2≥20%. Further, especially the reflectance of the first part is relatively high. In embodiments, the reflectance of the first part is at least 40%, such as at least 50%, like especially at least 60%. In further specific embodiments, 65%≤R1<100%.

Hence, in embodiments the transmission through the diffusively transmissive first part is smaller than through the diffusively transmissive second part. As indicated herein, transmission and/or reflection and/or absorption are especially determined under perpendicular radiation, and are especially determined at the same wavelengths.

In embodiments, the first part has a first transmission T1 for the light source light and the one or more second parts have a second transmission T2 for the light source light. Especially, the second transmission is larger than the first transmission, i.e. T2>T1. In embodiments, the first transmission T1 and the second transmission T2 have a ration T1/T2<1, especially T1/T2≤0.9, such as T1/T2≤0.8, like T1/T2≤0.7. For instance, in embodiments, T1/T2≤0.6, like T1/T2≤0.5. Even, in embodiments T1/T2≤0.4, or even T1/T2≤0.3, such as T1/T2≤0.2. In specific embodiments, T1/T2≥0.01, such as T1/T2≥0.05.

As indicated above, the second part area (A2) is smaller than the first part area (A1). In this way, the brighter parts may be smaller than the less bright part(s). In this way, a kind of filament perception may be created, especially when the second part has an elongated shape (see further below).

Hence, in specific embodiments, the one or more second parts have the shape of a slit. The term slit may especially refer to a structure with an aspect ratio larger than 1 (length larger than width, i.e. ratio of length to width), more especially an aspect ratio larger than 5, even more especially an aspect ratio larger than 10, most especially an aspect ratio larger than 20. Hence, there may be a larger first part, with therein a slit-like shaped second part. Under operation, the slit is brighter than the second part. This may contribute to the filament-like effect.

In order to improve contrast between the first part(s) and the second part(s), the reflectance of the first part may be relatively high. Hence, in embodiments 60%≤R1<100%, especially in embodiments 65%≤R1≤98%, like in further specific embodiments 75%≤R1≤95%. In order to improve contrast between the first part(s) and the second part(s), the difference in reflectances may also be high. Therefore, in embodiments R1−R2≥30%, yet even more especially R1−R2≥40%.

Further, the first part may substantially be larger than the second part(s). Or, in other words, the first area (of the first part(s)) may be substantially larger than the second area (of the second part(s)). Hence, in embodiments, 0.005≤A2/A1≤0.05. In more specific embodiments 0.005≤A2/A1≤0.1.

As filament lamps in general have a limited number of filaments, the number of second parts may also be limited. However, the chamber wall or "bulb" is not transparent, like in classical filament lamps. Hence, the number of second parts may be larger than one, but will also be limited, to keep the impression of a filament lamp. Therefore, in embodiments the light generating device may comprise 2-6 second parts. In further specific embodiments the light generating device comprises 3 second parts. Especially, the second parts are regularly distributed over the chamber wall. For instance, the light generating device may include a device axis, e.g. perpendicular to a lamp base. The second parts may be configured rotationally symmetric around such axis.

In embodiments, the one or more second parts may have a second part width (w1), wherein the second part width is selected from the range of 1 mm≤w1≤5 mm. As indicated above, the second part(s) may especially have a shape of a slit. In specific embodiments the one or more second parts have a second part length (L2), wherein the second part width (w1) and the second part length (L2) have a ratio select from the range of w1/L2≤0.5. Hence, the slits may have an aspect ratio (L2/w1) larger than 1. Hence, the second part may be elongated.

The elongated second part may have an axis (of elongation) which may be in a plane with an axis of the chamber. When there are a plurality of second parts, each axis (of elongated) of the respective second parts may be in a plane with an axis of the chamber. When there are two second parts, in embodiments these planes may coincide. When there are three second parts, there may be three planes with identical mutual angles. When there are four second parts, in embodiments sets of two planes may coincide, and the sets may have a mutual angle of 90°.

In embodiments, the light chamber has the shape of a light bulb having a chamber length (L1), wherein the one or more second parts have a second part length (L2), wherein the second part length (L2) is in embodiments at least 2 mm, such as especially at least 5 mm, wherein the second part length (L2) and the chamber length have a ratio selected from the range of 0.5≤L2/L1≤1. This may also provide or add to the filament-like appearance aspect.

As indicated above, differences in reflectance may in embodiments be obtained by providing the second part(s) with a reduced chamber wall thickness. Hence, in embodiments the first part has a first wall thickness (d1), the one or more second parts have a second wall thickness (d2), wherein the second wall thickness (d2) and first wall thickness (d1) have a wall thickness ratio 0.02≤d2/d1≤0.9, especially 0.05≤d2/d1≤0.8. In embodiments, 0.1≤d2/d1≤0.6.

Especially, the reflectance values over the area of the first part are essentially the same. Hence, e.g. in embodiments the reflectance of 550 nm light does essentially not vary spatially over the first part.

Likewise, especially the reflectance values over the area of the second part are essentially the same. Hence, e.g. in embodiments the reflectance of 550 nm light does essentially not vary spatially over the second part.

Especially, the light transmission values over the area of the first part are essentially the same. Hence, e.g. in embodiments the transmission of 550 nm light does essentially not vary spatially over the first part.

Likewise, especially the light transmission values over the area of the second part are essentially the same. Hence, e.g. in embodiments the transmission of 550 nm light does essentially not vary spatially over the second part.

As indicated above, the reflectance of the second part is especially lower than of the first part. Further, as indicated above, the transmission of the light source light through the second part is larger than through the first part. This may lead to the second part being brighter than the first part. The reflectance of the second part may be chosen in dependence of the chamber wall being a final window or being configured downstream of a final window. For instance, in embodiments, the light generating device further comprises a second chamber wall enclosing the chamber wall. As the appearance of the second part is not fully transmissive, either the second part has a non-ignorable reflectance and/or a light transmissive downstream of has a non-ignorable reflectance. Here, the term "window" refers to a solid material through which the light source light may be transmitted. Hence, light source light emanates from the window. In the former embodiments, the device light emanates from the chamber wall and in the latter embodiments the device light emanates from the second chamber wall, configured downstream from the (first) chamber wall.

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

Hence, assuming the chamber wall to be the final window of the light generating device, in embodiments the second reflectance R2 may be selected from the range of 10%≤R2≤70%, such as from the range of 15%≤R2≤65%, even more especially 20%≤R2≤60%. A too low reflectance may facilitate that the light emitting surface is visible, which is not desirable.

However, in other embodiments, the second reflectance R2 is selected from the range of R2<20%, wherein the light generating device further comprises a second chamber wall enclosing the chamber wall, wherein the second chamber wall is transmissive for the light source light, and wherein the second chamber wall has a third reflectance R3 for the light source light, wherein 5%≤R3≤70%. In such embodiments, it may also be possible that R2≈0%. In specific embodiments, 10%≤R2+R3≤70%, like 10%≤R2+R3≤40%. In embodiments wherein R3≥20%, R2≥10%. Note that the reflectance of the second chamber wall may be based on the same principles as described above in relation to reflectance and transmission. However, in specific embodiments the reflectance of the second chamber is essentially the same over the entire chamber wall (internal surface).

The light generating device may in embodiments be provided as retrofit lamp. Hence, in embodiments the invention also provides a retrofit light generating device.

In specific embodiments, the chamber wall has the shape of a candle (candle retro shape).

In yet a further aspect, the invention also provides a light generating system comprising (i) the light generating device as defined herein, wherein the light generating device is configured to generate device light, and (ii) a control system configured to control one or more lighting parameters of the device light. Especially, the control system is configured to control one or more of color temperature, color point, and luminous flux. Further aspects of the control system are also described above.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, etc.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily to scale.

DETAILED DESCRIPTION OF THE EMBODIMENTS

Figure 1A:
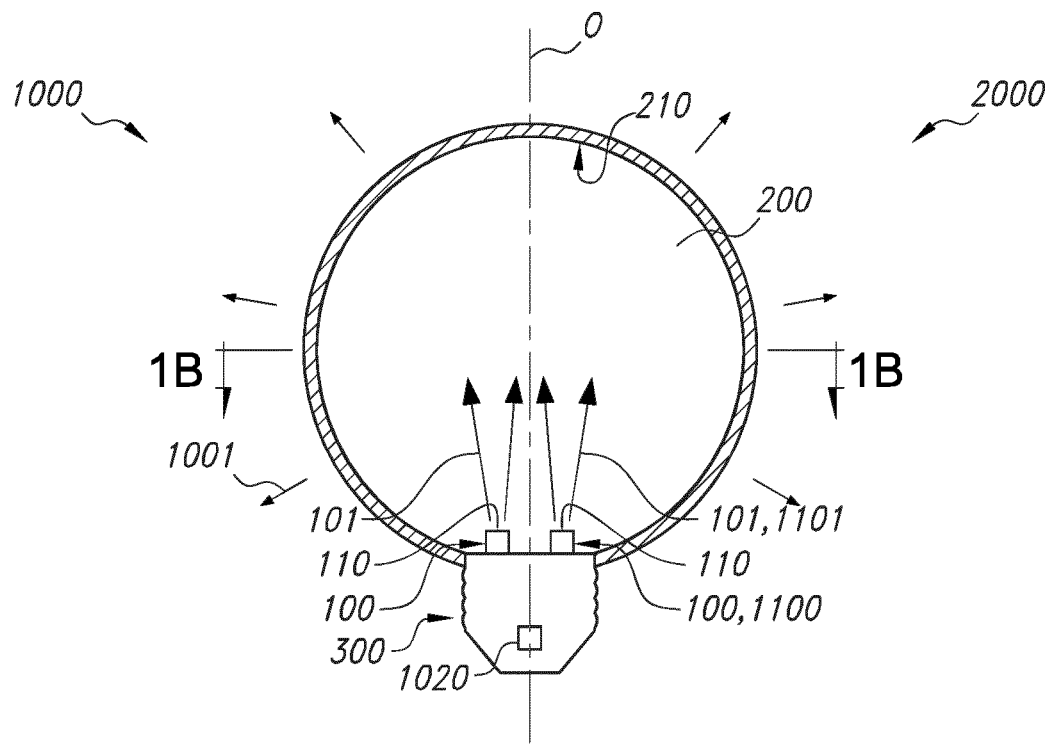
FIGS. 1a-1f schematically depict some aspects and embodiments of the invention.
Figure 1B:
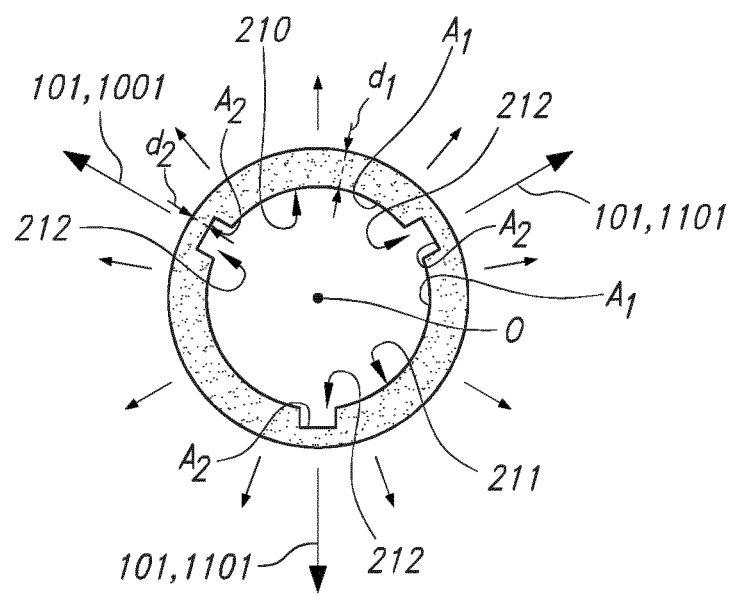

FIGS. 1a-1b schematically depicts an embodiment of a light generating device 1000. The light generating device 1000 comprises a light source 100, such as a solid state light source 1100, comprising a light emitting surface 110. The light source 100 is configured to generate light source light 101, such as solid state light source light 1001. The light emitting surface 110 is configured in a light chamber 200. The light chamber 200 is at least partly defined by a chamber wall 210.

FIG. 1b schematically depicts an embodiment of a cross-section of the embodiment of FIG. 1a.

As shown in FIG. 1b, the chamber wall 210 comprises a first part 211. The first part 211 is transmissive for the light source light 101. The first part 211 has a first reflectance R1 for the light source light 101, and the first part 211 has a first part area A1. The chamber wall 210 also comprises one or more second parts 212. Each second part 212 is transmissive for the light source light 101, has a second reflectance R2 for the light source light 101.

The one or more second parts 212 together have a second part area A2. The first part area A1 is the sum of the areas between the (three) second parts. These areas may also be indicated as tangential areas.

The areas are defined by the internal surface of the chamber wall 210. In embodiments, wherein R1−R2≥20%, wherein 65%≤R1<100%. Further, as schematically depicted the second part area A2 is smaller than the first part area A1. For instance, in embodiments 0.005≤A2/A1≤0.05 may apply.

As schematically depicted in FIG. 1b, the chamber wall 210 may comprise 2-6 second parts 212, wherein the second parts 212 are regularly distributed over the chamber wall 210. FIGS. 1a and 1b also schematically depict an axis O, which may be an optical axis. The second parts 212 may be configured rotationally symmetric about this axis.

As schematically depicted in FIG. 1a, the light generating device 1000 may comprise a plurality of solid state light sources 1100 configured to generate light source light 101 (more especially solid state light source light 1001). The solid state light sources 1100 comprise light emitting surfaces 1110 configured in the light chamber 200.

Light emanating from the chamber wall 210, i.e. from the device 1000, is indicated as lighting device light or device light 1001.

Figure 1C:
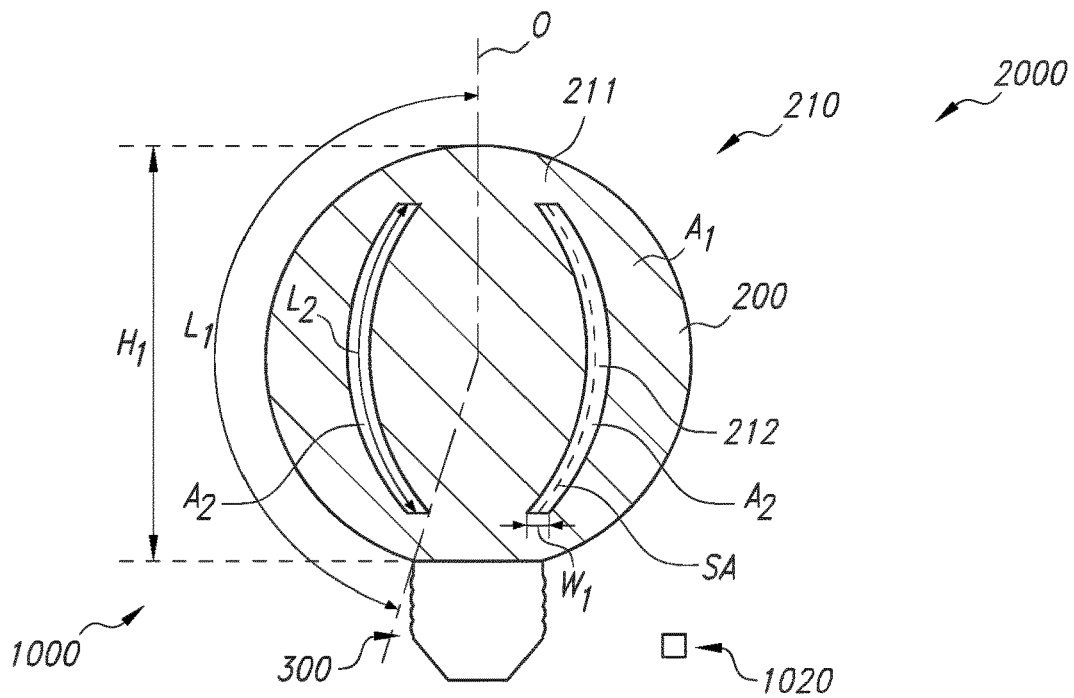

FIG. 1c schematically depicts a side view. As the chamber wall 210 is curved, also the second parts 212, which have here the shape of a slit, are curved.

As schematically shown in FIG. 1c, in embodiments the one or more second parts 212 have the shape of a slit. The elongated shaped second parts 212 may each have an (slit) axis SA. These axes may be in planes, respectively, with the axis O.

Figure 1D:
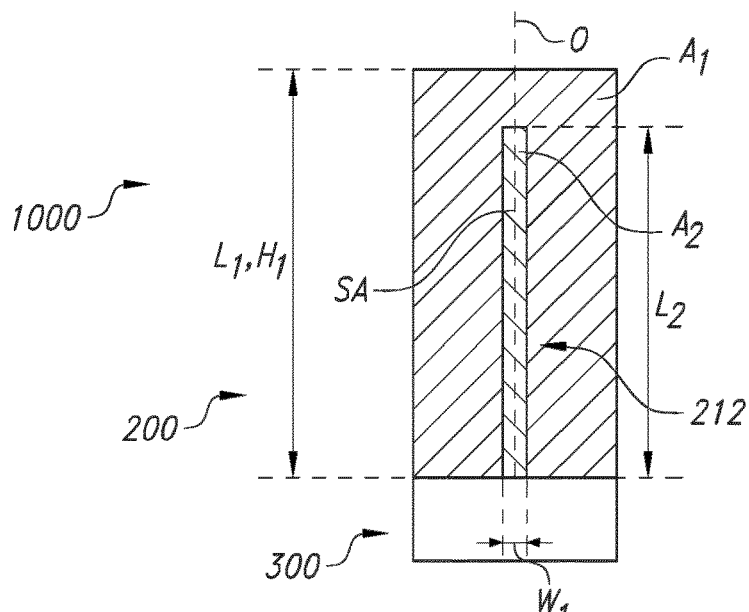

As schematically depicted in FIGS. 1c and 1d, the one or more second parts 212 have a second part width w1. In embodiments, the second part width is selected from the range of 1 mm≤w1≤5 mm. Further, the one or more second parts 212 have a second part length L2. In specific embodiments, the second part width w1 and the second part length L2 have a ratio select from the range of w1/L2≤0.5. The length L2 of the second part 212, the length L1 of the chamber wall 210, and the width w2 of the second part 212, are determined along the (internal) surface of the chamber wall. In the case of a cylinder, see FIG. 1d, the length L1 of the chamber wall is simply the height H1 of the cylinder, whereas in the case of a curvature, such as shown in FIG. 1c, the length L1 of the chamber wall is larger than the height H1 of the chamber wall.

As schematically depicted in FIG. 1c, the light chamber 200 may have the shape of a light bulb having a chamber length L1, wherein the one or more second parts 212 have a second part length L2, wherein the second part length L2 is at least 5 mm. In embodiments, the second part length L2 and the chamber length have a ratio selected from the range of 0.5≤L2/L1≤1.

Figure 1E:
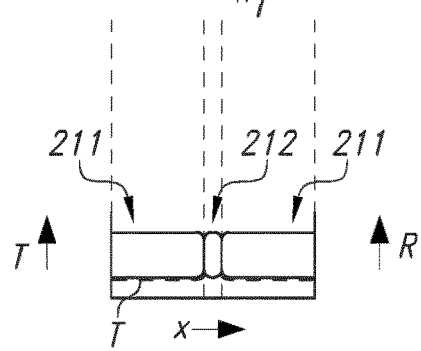

As schematically depicted in FIG. 1b the first part 211 may have a first wall thickness d1. Further, the one or more second parts 212 may have a second wall thickness d2. Especially, the second wall thickness d2 and first wall thickness d1 have a wall thickness ratio 0.05≤d2/d1≤0.8. This may lead to the differences in reflectance and transmission, as very schematically depicted in FIG. 1e.

As shown in FIGS. 1a, 1c, and 1d, the light generating device 1000 comprises a lamp base 300, wherein the light chamber 200 extends from the lamp base 300.

Figure 1F:
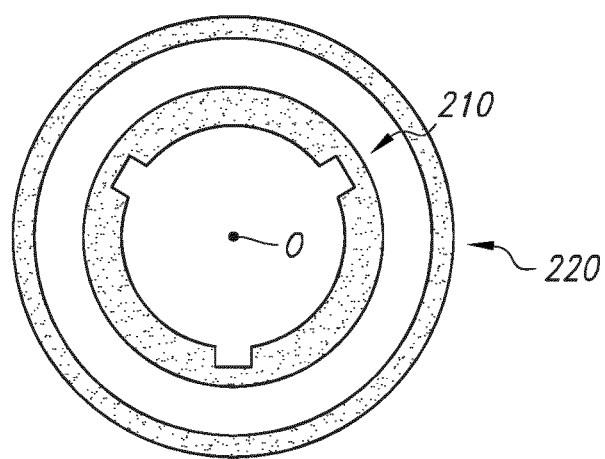

FIG. 1f schematically depicts an embodiment wherein the light generating device 1000 further comprises a second chamber wall 220 enclosing the chamber wall 210, wherein the second chamber wall 220 is transmissive for the light source light 101. The second chamber wall 220 has a third reflectance R3 for the light source light 101. For instance, 5%≤R3≤70%.

Hence, in an embodiment, the LED filament lamp comprises a further light mixing chamber at least partly enclosing the light mixing chamber for enabling improved light effects and filament appearance. The further light mixing chamber comprises a reflectance R3, wherein R3 is in specific embodiments in the range of 10% to 30%, more especially in the range of 15% to 27%, most especially in the range of 17 to 25%. The effect that may be obtained is an improved filament appearance.

As schematically depicted in FIGS. 1a and 1c, the light generating device 1000 is configured to generate device light 1001. Further, the light generating device 1000 may comprise a control system 1020 configured to control one or more lighting parameters of the device light 1001, see FIG. 1a, or may be functionally coupled to such control system 1020, see FIG. 1c.

Hence, FIGS. 1a and 1c also schematically depict embodiments of a light generating system 2000 comprising the light generating device 1000 and the control system 1020. The control system 1020 may in embodiments be configured to control one or more of color temperature, color point, and luminous flux.

In embodiments, herein a (color tunable) LED filament lamp which comprises a light source arranged in a mixing chamber (and a controller adapted to control the light source having a plurality of solid state light emitters) is suggested. The mixing chamber comprises light transmissive regions which delimit light exit areas which have a higher light transmissivity than the light transmissive regions. The light transmissive regions and the light exit areas may exhibit isotropic luminance. Said light exit areas may have the shape of a slit. The light transmissive regions and the light exit areas may have a reflectance R1 and R2, respectively. R1 may be in the range from 75% to 95% and R2 may be in the range from 15 to 60% for light emitted from the light source. R1−R2≥30%. The number of slits may especially be in the range from 2 to 6 such as e.g. 3 and slit width is typically around 3 mm. Suggested (LED) filament lamp may provide good color mixing and. The slit shaped light exit areas mimic filaments due to their shape, contrast in and level of reflectance with respect to the light transmissive regions.

Figure 2:
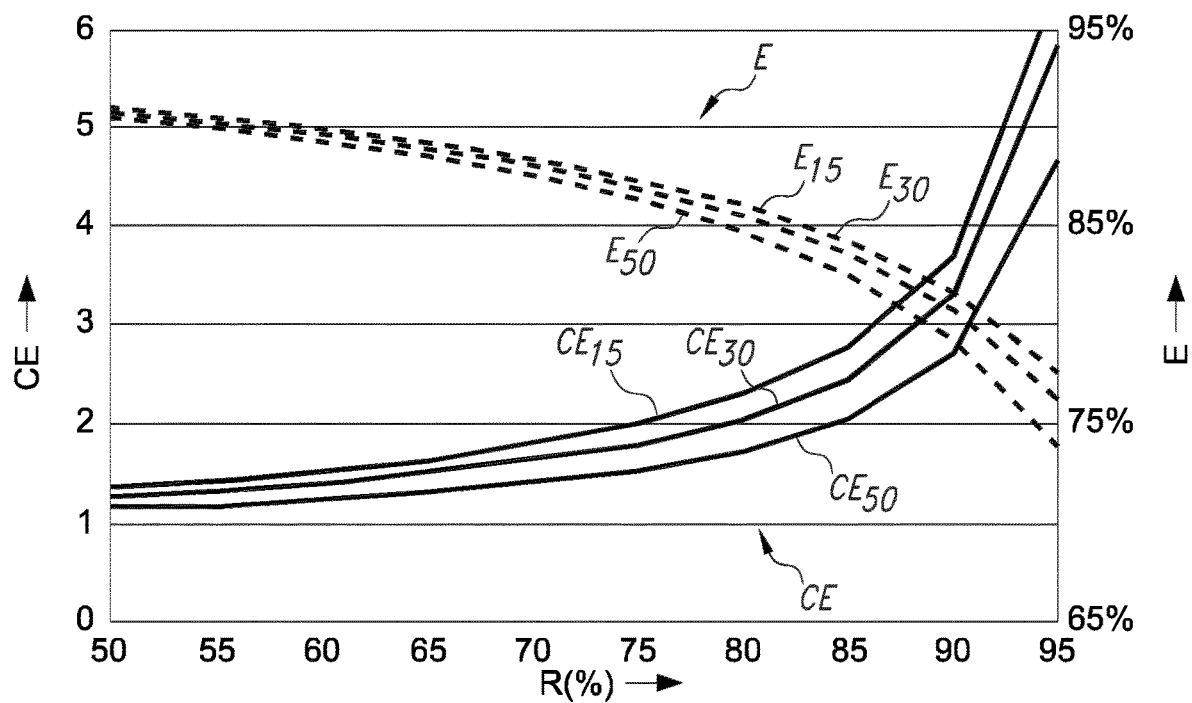
FIG. 2 shows the illumination simulation of candle scattering inner dome with slits of different transmission. Three slits which have a width of 3 mm are used in the simulation

FIG. 2 shows the illumination simulation of candle scattering inner dome with slits of different transmission. Three slits which have a width of 3 mm are used in the simulation. The solid lines CE indicate the contrast (ratio) between the maximum intensity and minimum intensity. The dashed lines E indicate the efficiency of the lighting device. On the x-axis the reflectance in % of the inner dome, i.e. the first part(s) is indicated. The values 15, 30 and 50 indicate the reflectances of the second parts.

The contrast ratio is especially at least 2, more especially at least 3, and most especially at least 4. The obtained effect improved filament appearance. From the data it can be concluded that R2 is preferably in the range from 10% to 60%, more preferably R2 is in the range from 15% to 50%, most preferably R2 is in the range from 20% to 40%. The obtained effect is no spottiness. The reason is that the back reflection enables hiding of the LEDs. The slits may be symmetrically arranged and the number of slits is especially in the range from 2 to 6, more preferably 3 to 4, most preferably 3. The obtained effect is improved filament appearance. The reason is that with 3 slits each positioned at 120 degrees only 1 or max 2 slits are visible. Given the ranges for R2 and the contrast ratio, R1 is especially in the range of 75% to 95%, more especially in the range of 85% to 95%, most especially in the range of 90% to 95%. The transmission T2 is especially above 5% because otherwise the efficiency of the lamp may be too low. Furthermore, T2<5% may result in a poor omnidirectional lighting.

Figures 3A, 3B, 3C:
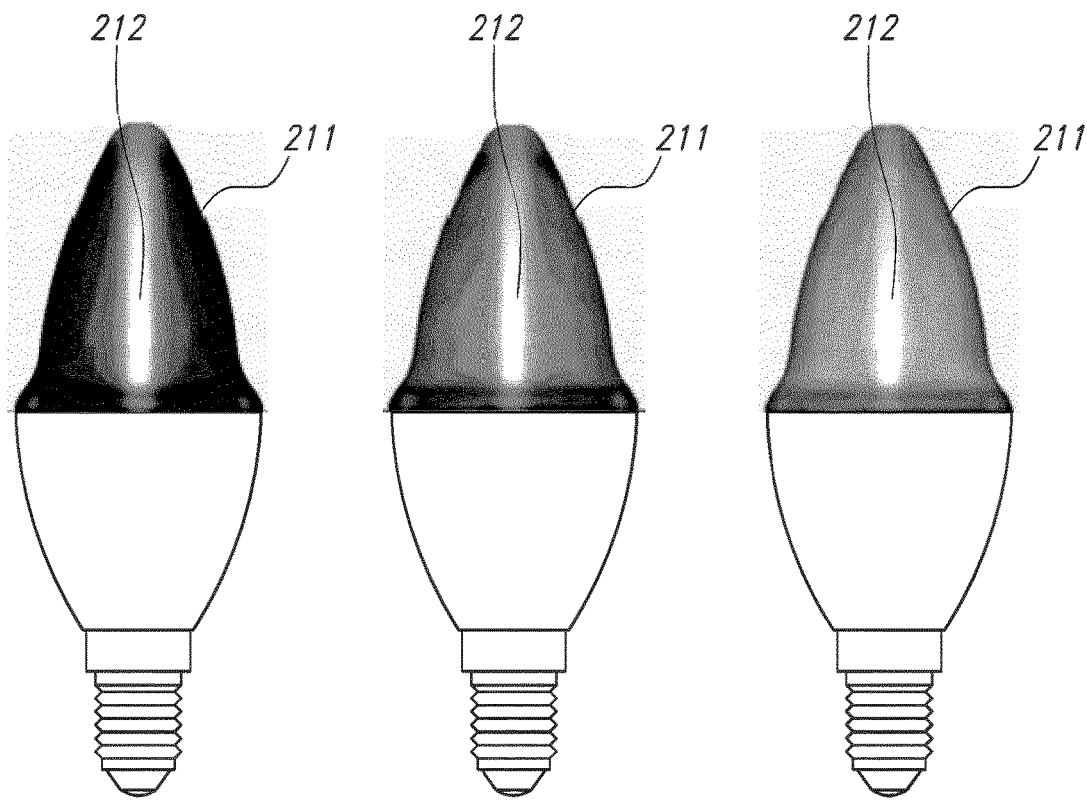
FIG. 3a-3c shows various simulation results according to the ranges described above.

FIG. 3 shows various simulation results with lamps according to the ranges described above; in FIGS. 3a-3c, the reflectance of the second part 212 is 15%. These figures show the contrasts. The reflectance of the first part 211 (main part) is 95%, 90%, and 80%, respectively. Hence, the contrast is 7, 3.7, and 2.3, respectively. The efficiencies are 77%, 81%, and 86%, respectively, wherein the efficiency is defined as the quotient of the light emanating from the light generating device (as device light) and the light source light generated by the light source(s).

Figure 4A:
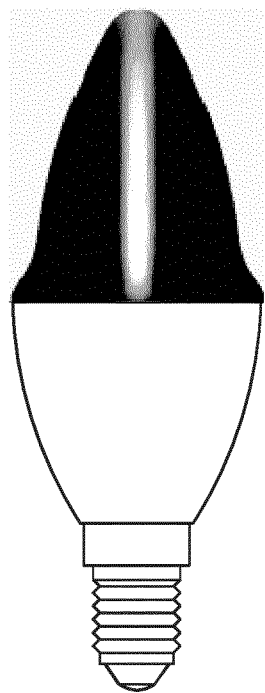
FIGS. 4a-4b schematically depict embodiments of the filament with different slit widths.
Figure 4B:
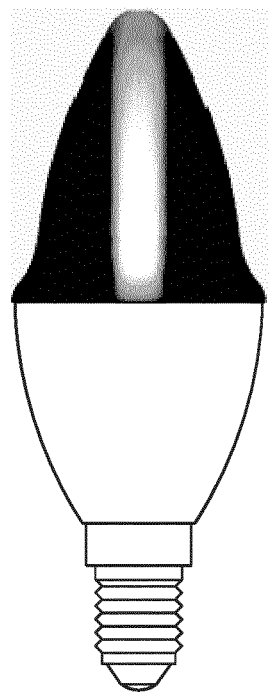

Slit having a width larger than 6 mm are undesired because the result is a decrease filament appearance (FIG. 4). FIG. 4a has a slit width or width of the first part of 3 mm, and the embodiment of 4b of 6 mm. In FIGS. 4a-4b, the reflectance of the second part is 15%. The reflectance of the first part (main part) is 97%. The contrast for both embodiments is 35. The efficiencies are 40% and 60%, respectively.

Figure 5A:
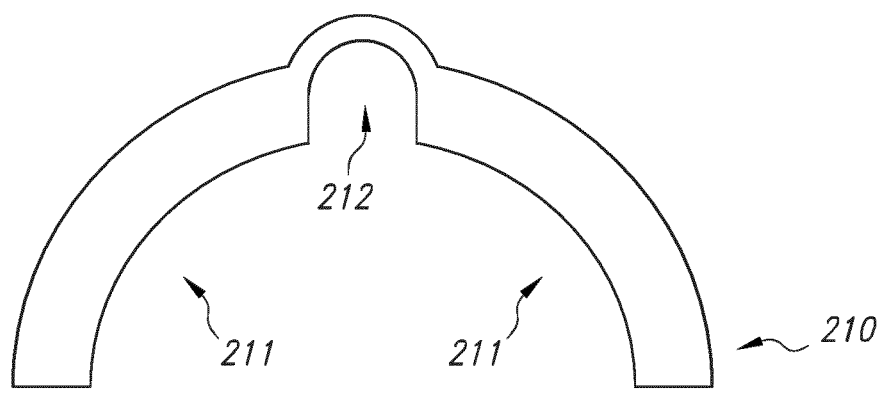
FIGS. 5a-5b schematically depict some embodiments of the second part.

In embodiments, the second parts 212, such as slit shaped light exit areas, may protrude the first part(s) 211 (FIG. 5a). The effect that may be obtained is improved filament appearance.

Figure 5B:
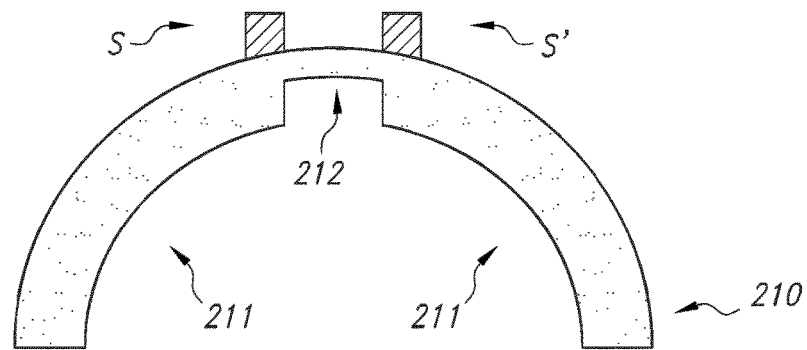

In embodiments, the second parts 212, such as slit shaped light exit areas, may be highlighted with a colored striping or metallic striping S (FIG. 5b). The effect that may be obtained is improved filament appearance.

Differences in reflectance can be obtained by controlling the concentration of the light scattering materials and/or thickness of the mixing chamber. Light scattering materials include but are not limited to $BaSO_4$, $Al_2O_3$, $TiO_2$, and/or silicone particles. These particles can be incorporated in a polymer matrix such as a matrix of silicone (in general, than no silicone particles will be used, but e.g. inorganic light scattering particles), polycarbonate, or PMMA. One may (thus) also use silicone particles in a PC or PMMA polymer matrix. The surface of the slit may also comprise a roughness or structures to prevent direct view of the LEDs. Reflection of such surface is also at least 10%.

Figure 6:
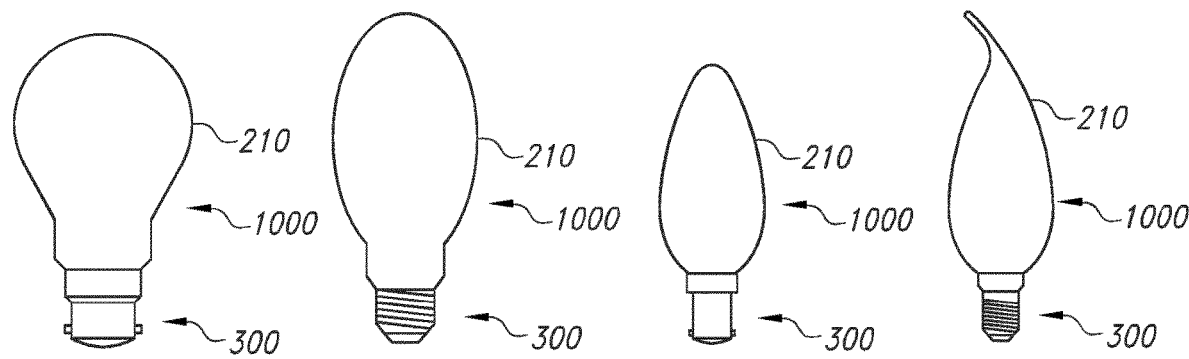
FIG. 6 schematically depict some further embodiment of shapes of the chamber wall.
Figure 6:
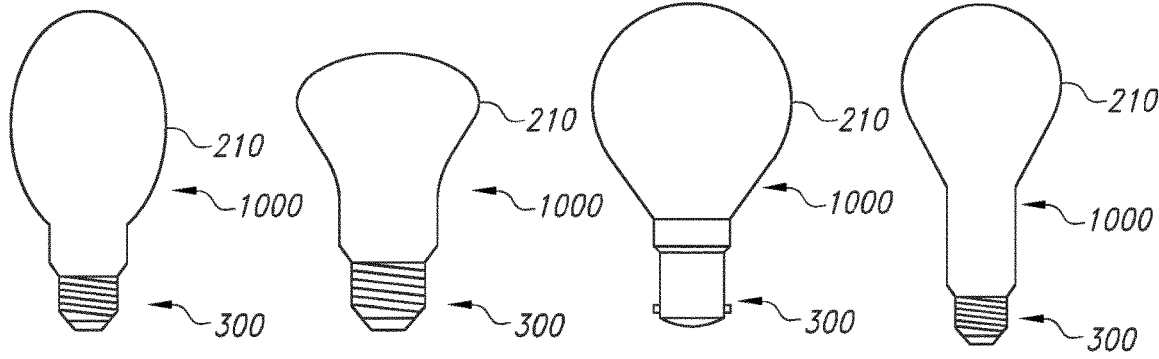

FIG. 6 schematically depicts some non-limiting possible shapes of the chamber walls 210. More precisely, here the external surface of the chamber wall is depicted. The internal surface of the chamber wall will be essentially the same as of the external surface. Note that other shapes than schematically depicted may also be possible. Embodiment 1 schematically depicts to a piriform-like shaped chamber wall. Embodiment 2 schematically depicts a bulged shaped chamber wall. Embodiment 3 schematically depicts to a candle shaped chamber wall. Embodiment 4 schematically depicts an angular candle shaped chamber wall. Embodiment 5 schematically depicts an ellipsoidal shaped chamber wall. Embodiment 6 schematically depicts a krypton shaped chamber wall. Embodiment 7 schematically depicts a pear shaped chamber wall, which is (slightly) different from the piriform-like shaped chamber wall of the first embodiment. Embodiment 8 schematically depicts a pear-straight shaped chamber wall. The combination of lamp base 300 and chamber wall in the eight proposed embodiments are non-limiting combinations. Other combinations and even other lamp bases may also be possible.

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" includes also embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A light generating device comprising:
a light source comprising a light emitting surface, wherein the light source is configured to generate light source light, wherein the light emitting surface is configured in a light chamber;
wherein the light chamber is at least partly defined by a chamber wall, wherein the chamber wall comprises:
(i) a first part, wherein the first part is transmissive for the light source light, wherein the first part has a first reflectance R1 for the light source light, and wherein the first part has a first part area; and
(ii) one or more second parts, wherein each second part is transmissive for the light source light, has a second reflectance R2 for the light source light, and wherein the one or more second parts together have a second part area, wherein R1-R2≥20%, wherein 65%≤R1<100%, wherein the second part area is smaller than the first part area, and wherein 0.005 A2/A1 ≤0.05.

2. The light generating device according to claim 1, wherein the one or more second parts have the shape of a slit.

3. The light generating device according to claim 1, wherein 75%≤R1<95%.

4. The light generating device according to claim 1, wherein R1-R2≥30%.

5. The light generating device according to claim 1, 0.005≤A2/A1≤0.1.

6. The light generating device according to claim 1, wherein R1-R2≥40%.

7. The light generating device according to claim 1, comprising 2-6 second parts, wherein the second parts are regularly distributed over the chamber wall, and wherein the light generating device comprises a plurality of solid state light sources configured to generate light source light, wherein the solid state light sources comprise light emitting surfaces configured in the light chamber.

8. The light generating device according to claim 1, wherein the one or more second parts have a second part width (w1), wherein the second part width is selected from the range of 1 mm≤w1≤5 mm, wherein the one or more second parts have a second part length (L2), wherein the second part width (w1) and the second part length (L2) have a ratio select from the range of w1/L2≤0.5.

9. The light generating device according to claim 1, wherein the first part has a first wall thickness (d1), wherein the one or more second parts have a second wall thickness (d2), wherein the second wall thickness (d2) and first wall thickness (d1) have a wall thickness ratio 0.05≤d2/d1≤0.8.

10. The light generating device according to claim 1, wherein the light chamber has the shape of a light bulb having a chamber length (L1), wherein the one or more second parts have a second part length (L2), wherein the second part length (L2) is at least 5 mm, wherein the second part length (L2) and the chamber length have a ratio selected from the range of 0.5≤L2/L1≤1.

11. The light generating device according to claim 1, wherein the light generating device comprises a lamp base, wherein the light chamber extends from the lamp base.

12. The light generating device according to claim 1, wherein the second reflectance R2 is selected from the range of 10%≤R2≤70%.

13. The light generating device according to claim 1, wherein the second reflectance R2 is selected from the range of R2<20%, wherein the light generating device further comprises a second chamber wall enclosing the chamber wall, wherein the second chamber wall is transmissive for the light source light, and wherein the second chamber wall has a third reflectance R3 for the light source light, wherein 5%≤R3≤70%.

14. A light generating system comprising (i) the light generating device according to claim 1, wherein the light generating device is configured to generate device light, and (ii) a control system configured to control one or more lighting parameters of the device light.

15. The light generating system according to claim 14, wherein the control system is configured to control one or more of color temperature, color point, and luminous flux.

* * * * *